United States Patent
Frecassetti et al.

(10) Patent No.: US 6,335,660 B1
(45) Date of Patent: Jan. 1, 2002

(54) PRE/POST-DISTORTION CIRCUIT AND METHOD, PARTICULARLY FOR MICROWAVE RADIO-FREQUENCY SYSTEMS

(75) Inventors: Mario Giovanni Luigi Frecassetti, Bergamo; Marco Frigerio, Cesano Maderno (Milan); Salvatore Gugliuzzo, Lecco, all of (IT)

(73) Assignee: Alcatel, Paris (FR)

(*) Notice: Subject to any disclaimer, the term of this patent is extended or adjusted under 35 U.S.C. 154(b) by 0 days.

(21) Appl. No.: 09/527,439

(22) Filed: Mar. 17, 2000

(30) Foreign Application Priority Data

Mar. 23, 1999 (IT) .......................................... MI99A0581

(51) Int. Cl.[7] .............................................. H03F 1/26
(52) U.S. Cl. ..................................... 330/149; 330/124 R
(58) Field of Search ............................. 330/124 R, 136, 330/149, 284; 375/297

(56) References Cited

U.S. PATENT DOCUMENTS

| | | | |
|---|---|---|---|
| 4,392,252 A | 7/1983 | Cluniat | 330/124 R |
| 5,015,965 A | 5/1991 | Katz et al. | 330/149 |
| 5,126,687 A * | 6/1992 | Onoda et al. | 330/149 |
| 5,151,664 A * | 9/1992 | Suematsu et al. | 330/149 |
| 5,576,660 A * | 11/1996 | Pouysegur et al. | 330/149 |
| 5,815,038 A | 9/1998 | Ogura et al. | 330/149 |
| 6,054,894 A * | 4/2000 | Wright et al. | 330/124 R |

FOREIGN PATENT DOCUMENTS

| | | |
|---|---|---|
| EP | 0 435 578 A2 | 7/1991 |
| GB | 1 519 254 A | 7/1978 |
| WO | WO 97/05694 | 2/1997 |

\* cited by examiner

*Primary Examiner*—Robert Pascal
*Assistant Examiner*—Khanh Van Nguyen
(74) *Attorney, Agent, or Firm*—Sughrue, Mion, Zinn, Macpeak & Seas, PLLC

(57) ABSTRACT

A pre/post-distortion circuit particularly for microwave radio-frequency systems is disclosed. The pre/post-distortion circuit according to the present invention, comprising an input signal (I) controlled attenuator (AT), is characterized by further comprising divider means (DI) for properly subdividing said input signal (I) and transmitting it to respective channels (A, B, C), a first (C) of said channels comprising means (PS, DC) for repeating or cloning, from a distortion point of view, the signal whose circuit one wishes to pre/post distort, the others (A, B) of said channels comprising substantially linear networks (LN), and adding means (AD) to sum the signals coming out of said channels (A, B, C). A method is also disclosed for pre/post-distorting a signal, particularly in radio-frequency systems.

19 Claims, 2 Drawing Sheets

PRE/POST-DISTORTION CIRCUIT AND METHOD, PARTICULARLY FOR MICROWAVE RADIO-FREQUENCY SYSTEMS

BACKGROUND OF THE INVENTION

1. Field of the Invention

The present invention relates to the linearization of nonlinear networks and in particular concerns an adaptive pre/post-distortion circuit for microwave radiofrequency systems, which is independent of the type of modulation.

2. Description of the Prior Art

The nonlinearity phenomena affect several fields of the engineering. An important aspect, which substantially constitutes the subject of the present invention, is that connected to the nonlinearity phenomenon of the amplifiers used in the electronic systems applied to telecommunications and in particular, without excluding others, to the transmission of digital signals.

In modern radio transmission systems, the use of complex modulations, such as the multilevel ones, requires more and more complex transceiver systems. In particular, in modern digital signal transmission, signals with high peak-to-average power ratios must be transmitted. In order to obtain a good quality of transmission by utilizing these types of signals, it is necessary to keep the extent of the processed signal distortion below a preset level.

This fact often forces the designers to use, for instance in the transmission systems, class A power amplifiers with high back-off values, hence with low energy efficiency.

The main known linearization techniques can be classified into four different main groups or methods: a) Feed-forward; b) Feed-back; c) Baseband digital predistortion; and d) FI or RF analog predistortion. Every specific solution may in turn be implemented according to an adaptive or non adaptive technique.

In the adaptive technique, the linearization apparatus reads the output produced by the power amplifier and, depending on the detected values, updates its internal parameters so as to minimize the extent of the produced distortions. It is easy, to understand how, from a conceptual point of view, it is the ideal solution as it adapts, through a suitable algorithm, the linearization function to the real behavior of the system; unfortunately, in practice, the realization is complex and, above all, expensive.

In the non adaptive technique, on the contrary, the linearization device is adjusted once and for all during calibration, so as to ensure an average behavior which is as satisfactory as possible. The system is more simple, but with lower performances, since there is not a feedback that controls the actual status of the distortion at the output of the transmitter.

WO9705694 concerns a predistortion linearizing device for an RF power amplifier with two amplifiers and a delay line with outputs fed to a Wilkinson combiner producing the predistortion signal fed to a power amplifier. However, such a known device is not easily adaptable to all types of systems and is difficult to be made adaptive. Moreover, it does not allow the correction of distortions of any order and type and it is hardly adaptable to systems with modifiable output power (for example, ATCP).

SUMMARY OF THE INVENTION

It is, therefore, the main object of the present invention to provide a pre/postdistortion circuit for microwave radio-frequency system which is independent of the type of modulation and it is so structured to be able to operate both in an adaptive and in a non adaptive manner.

A further object of the present invention is to provide a pre/post-distortion circuit which easily adapts itself to any network topology and which is particularly simple to be used in adaptive systems.

Still a further object of the present invention is to provide a pre/post-distortion circuit that corrects distortions of any order and type and that, particularly for the case of amplifiers, corrects distortions due both to possible drivers and to the terminal or to only one of them.

These and further objects are achieved by a pre/post-distortion circuit according to the invention having the features set forth in the independent claim 1. The invention further provides a method of pre/post-distorting a signal, particularly in radio-frequency systems, according to claim 8. Further advantageous characteristics of the present invention are set forth in the dependent claims The basic idea of the present invention consists in producing a clone of the distortion portion of the signal generated by the power amplifier and feeding it with the input signal, with the right level and the correct phase, in order to eliminate distortions from the output signal.

The invention will become clear from the following detailed description, given by way of a mere exemplifying and non limiting example, to be read with reference to the attached illustrative sheets of drawings.

BRIEF DESCRIPTION OF THE DRAWINGS

In the various figures.

The same reference characters throughout the various figures will be used to designate the same components or functionally equivalent components.

DESCRIPTION OF THE BEST MODE FOR CARRYING OUT THE INVENTION

The present invention falls under the category of analog predistortion and is utilizable both at IF (Intermediate Frequency) and RF (Radio Frequency). Moreover, it is structured in such a way that it can operate both in an adaptive and in a non adaptive manner.

In the following, the operation principle of the predistortion circuit according to the present invention will be described in the special case of use for the linearization of an amplifier, without detracting from the generalities of the argument that implies the possible use of this circuit for linearizing any nonlinear circuit.

At the output O of an amplifier it is desired to obtain an amplified replica G of an input signal I but, because of its nonlinear characteristics, one find the desired signal (G*I) overlapped by an error signal termed distortion D (i.e. G*I+D). The operation principle of a predistortion circuit is to predistort the input signal in such a way that only the desired signal (G*I) is obtained at the output O of the amplifier.

The predistortion circuit of the present invention generates the predistorted signal in an original manner and is easily adaptable to any amplifier, and more in general nonlinear network, architecture.

The principles of operation are based upon the generation of a distorted signal:

$$S_D=(G_D*I+D_D)$$

having characteristics equal or similar to those of the circuit to be linearized.

To do this, the present invention provides for the production of a circuit similar to the circuit to be linearized both as to behavior and as to circuit topology, and this can be done as described hereinafter.

Hence the produced distorted signal $S_D$ is subtracted from the properly amplified ($G_A$) input signal I, $$G_D*I-(G_D*I+D_D)=-D_D$$

thus obtaining only the distortion portion ($D_D$) except the sign. At this point, the distortion portion ($-D_D$) is again added to the signal to be amplified $$S_P=(G_D*I-D_D)$$

thus obtaining a predistorted signal, because the distortion portion has been added with proper phase.

At this point, if this signal passes through an amplifier having characteristic $$S_U=(G_a*I_a+D_a)$$

neglecting the distortion due to the distortion of the input signal, i.e.

$$D_a(G_D*I-D_D)=D_a(G_D*I)$$

at the output we will obtain the signal $$S_U=G_a*(G_D*I-D_D)+D_a=G_a*G_D*I-G_a*D_D+D_a$$

If $-G_a*D_D+D_a=0$ (relation which quantifies the term "similar" used above) one obtains:

$$S_U=G_a*G*I$$

hence the amplified, but undistorted, input signal.

Nothing changes if the circuit in question is rather located downstream of the circuit to be linearized than upstream, thus becoming a post-distortion circuit, useful in the receive systems.

Figure 1:
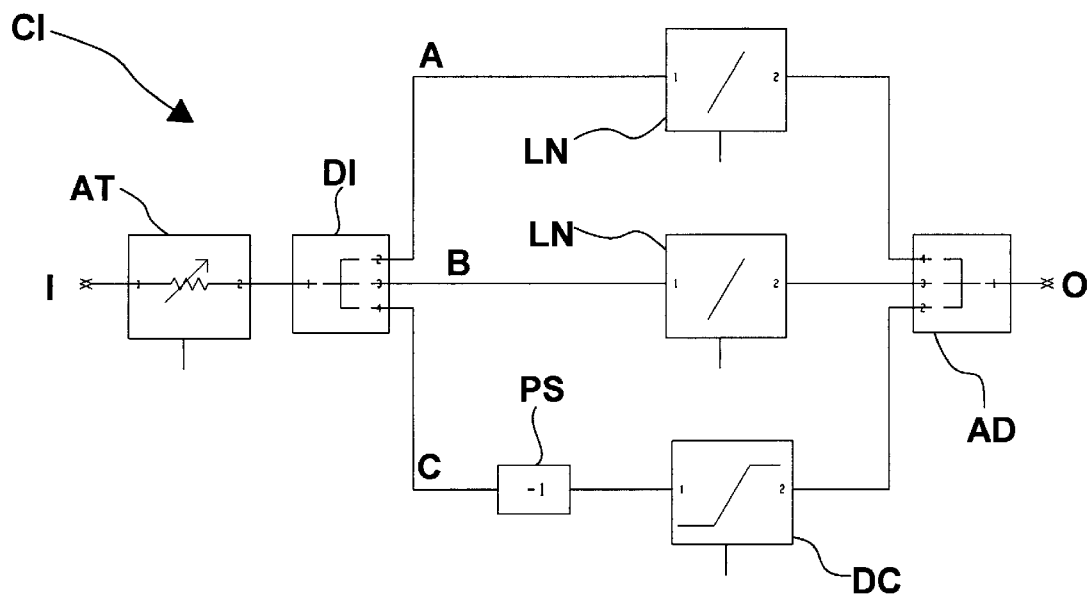
FIG. 1 shows a basic diagram of the linearization circuit according to the present invention.

In FIG. 1 there is represented the basic diagram of the linearization circuit in accordance with the present invention. The circuit CI comprises:

an input signal I controlled attenuator AT;

two three-way dividers/adders DI/AD; and three channels, identified as A, B and C in the following.

The operation principle is the following.

Signal I is divided into three equal portions and fed to three separated channels A, B, and C arranged in parallel each other. The basic channel is that which is identified as C and is composed of: an inverter PS (amplifier with G=−1) and a distortion circuit DC. Channels A and B substantially comprise linear networks LN.

The function of channel C is to "clone" from the distortion standpoint the circuit which one desires to linearize.

In this channel the signal is passed through an amplifier, or a circuit having the function of distorting the signal with characteristics which are similar, as far as both AM/AM and AM/PM distortions are concerned, to those of the circuit which one desires to linearize. This operation can be made in the following ways:

by using a device equal to that one to be linearized.

by using a similar device but having a low power level (hence inexpensive).

by using a similar low power level device at intermediate frequency by using a circuit which distorts in a proper manner, i.e. by repeating the distortion of the object to be linearized, at the same frequency or at intermediate frequency.

What is important is using the same circuit topology so as to reproduce the distortions as exactly as possible.

For example, if the circuit to be linearized is composed by three cascaded amplifiers, the circuit to be implemented is preferably composed by three cascaded amplifiers with characteristics, from the distortion point of view, similar to those of the circuit to be linearized, and with the same Backoff values.

In the special case of an amplifier which utilizes, for instance, consumption reduction systems that modify the distortion characteristics thereof, it is preferable that also the circuit C implements them.

From the above, it follows that this system is utilizable, without any limitation, in any circuit, also in those circuits already using linearization systems, absorbed power reduction systems or the like.

Channels A and B, substantially two linear networks, from a conceptual point of view are equal and their function is to process the signal in such a way as:

To be undistorted,

To provide the same gain as the chain C (as far as the undistorted portion thereof is concerned); and To provide the same group delay as the chain C.

The input/output characteristic of the nonlinear device CD can be analytically approximated by means of a power series expansion $$V_U=K_1V_E+K_3V_E^3+K_5V_E^5+\ldots$$

where the even terms are not considered because their contributions are out of the band of interest and therefore they are of no interest to the present invention.

Setting the input signal conventionally equal to $V_{in}=3*V_E$, at the output of channel C there is the signal (considering the first undesired term only):

$$V_{UC}=-(K_{1C}V_E+K_{3C}V_E^3)$$

where the minus sign accounts for the fact that there is an inversion (180°).

At the output of channels A and B there is the signal:

$$V_{UA}=(K_{1A}V_E)$$

$$V_{UB}=(K_{1B}V_E)$$

where the distortion terms are not considered because the two chains are operating in the linear zone, and therefore, having imposed the equality of the gains, i.e.

$$K_{1A}=K_{1B}=K_{1C}=K_1$$

at the output of the predistortion system, we obtain:

$$V_{UT}=V_{UA}+V_{UB}+V_{UC}=K_1V_E-K_3V_E^3$$

Feeding now the amplifier to be linearized with this signal, we obtain:

$$V_{UF} = (K_{1F}V_{UT} + K_{3F}V_{UT}^3)$$

Dividing by $K_{1F} * K_1$ we obtain:

$$V_E + \left(K_1^2 \frac{K_{3F}}{K_{1F}} - \frac{K_3}{K_1}\right) * V_E^3 - 3 * \frac{K_{3F} * K_1 * K_3}{K_{1F}} * V_E^5 +$$

$$3 * \frac{K_{3F} * K_3^2}{K_{1F}} * V_E^7 + \frac{K_{3F} * K_3^3}{K_{1F} * K_1} * V_E^9$$

Hence, if it is verified that: $K_1^2 \frac{K_{3F}}{K_{1F}} = \frac{K_3}{K_1}$ the coefficient of the $V^3$ term of the formula vanishes. Terms containing $V^5, V^7, V^9$ are of higher degree and therefore negligible. It follows that the output signal is undistorted.

The nullifying condition corresponds to the condition to be satisfied that two devices be similar from the standpoint of distortions.

It can be noted that for a good linearization, it is sufficient that the above equation is satisfied with a good approximation. In fact, by comparing the distortion term with and without the linearization circuit, an improvement is obtained if the inequality is satisfied:

$$\left(K_1^2 \frac{K_{3F}}{K_{1F}} - \frac{K_1}{K_1}\right) < K_1^2 \frac{K_{3F}}{K_{1F}}$$

where the extent of the imparted correction is highlighted in a more apparent manner.

Figure 2:
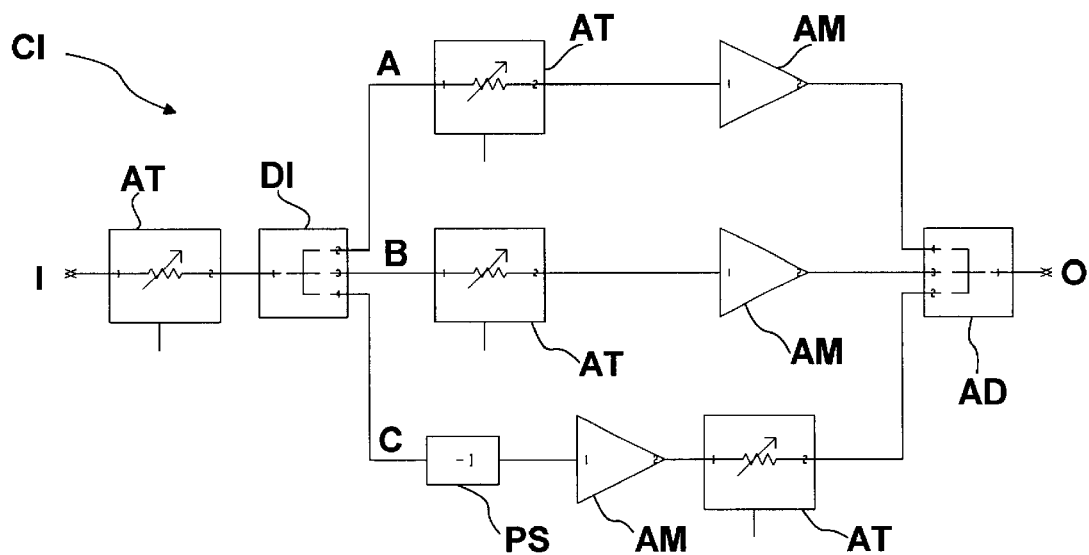
FIG. 2 shows a possible implementation of the circuit according to the present invention.
Figure 3:
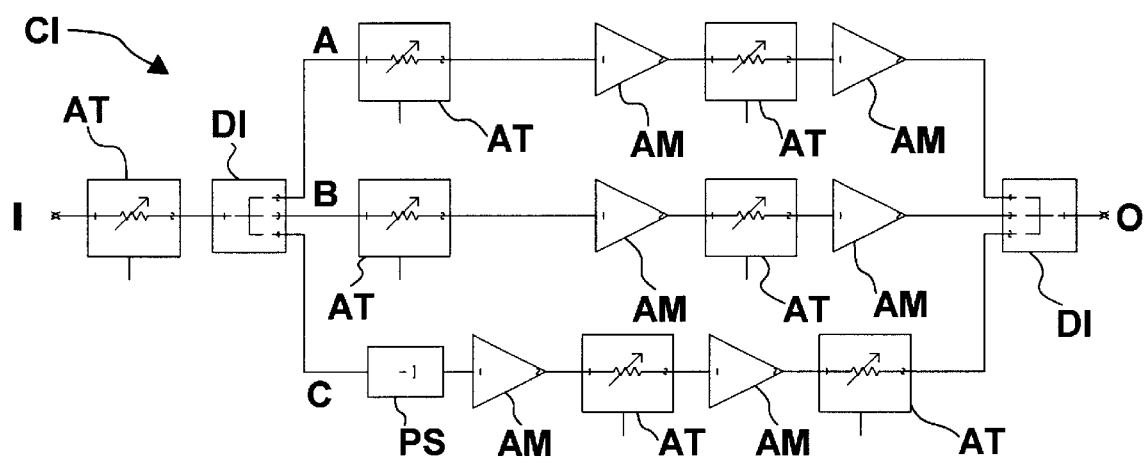
FIG. 3 shows a further possible implementation of the circuit according to the present invention.

In the circuit of FIG. 2, the linear network of channels A and B comprises an attenuator AT and an amplifier AM; the distortion circuit comprises in turn an amplifier AM and an attenuator AT. In the circuit of FIG. 3, the linear network of channels A and B comprises an attenuator AT disposed between two amplifiers AM; the distortion circuit DC comprises an amplifier AM, an attenuator AT, a further amplifier AM and a further attenuator AT.

With the circuit of FIG. 2 at 140 MHz, driven by a digital signal (32 QAM, 155 Mbits/s) for linearizing a cascade 140 MHz amplifier, extremely positive results have been obtained.

The same circuit has been used for linearizing an 8 GHz amplifier, by passing the predistorted signal through an Upconverter, so as not to reverse the spectrum, and hence in a power amplifier with a 12 W last stage and also in this circumstance the results were remarkable.

A further test has been carried out by utilizing the circuit of FIG. 3 which adapts better to the microwave amplifier topology, obtaining also in this circumstance hopeful results. It was also checked that the circuit linearizes on and on, varying the output power through the input attenuator.

A still further test consisted in checking the distortion only due to the driver. A chain with driver distorting before the last stage has been microwave mounted. At this point, acting on the Backoff correction attenuator to get the same condition, the correction of the system occurred.

This fact leads one to conclude that, through the readout of the output distortion value, it is possible, by means of a suitable algorithm, to make the circuit adaptive.

In particular, it will now be apparent that the main features that make the present invention original in comparison with similar systems, such as that one described in the above-cited WO9705694, are:
1. Possibility of correcting distortions due to nonlinearity in systems of any kind.
2. Possibility of correcting distortion of any order type, in particular in the case of amplifiers, the device according to the invention corrects the distortions due to both the possible drivers and to the last stage, or to only one of these.
3. Possibility of adapting to systems with modifiable output power, for instance ATPC.
4. Simplicity of drive to make it adaptive.
5. Possibility of linearization also in the event of variation of the relative backoff between driver and last stage due to e.g. temperature or failures, in the event of adaptive control.
6. Simplicity of adaptation to all system typologies.

Concluding, the present invention provides a circuit scheme capable of producing a predistorted signal ensuring the linearization of generic nonlinear networks The scheme easily adapts to any network topology, and is particularly simple to be utilized in adaptive systems.

It is apparent that several modifications, variants and replacements of parts with functionally equivalent ones may be imparted to the embodiments illustrated and described in detail above without departing from the scope defined by the following claims which are considered an integral part of the present description.

What is claimed is:

1. A circuit for pre-distorting an input signal and providing a corresonding pre-distorted output signal feeding a non linear circuit to be linearized, particilrly for microwave radio-frequency systems, comprising:
    a controlled attenuator for attenuating said input signal,
    a divider for properly subdividing said input signal into subdivided input signals;
    a plurality of channels each receiving a corresponding one of said subdivided input signals, a first of said channels comprising a distortion replicating circuit including at least an inverter and producing a signal having substantially the same distortion as a signal which will be at an output of the non linear circuit to be linearized, the other of said channels comprising respective substantially linear networks; and
    an adder for summing signals from said channels.

2. A circuit according to claim 1, wherein said distortion replicating circuit comprises a circuit substantially similar to the non linear circuit to be linezed, possibly having a power level which is lower than a power level of said non linear circuit.

3. A circuit according to claim 1, wherein said distortion replicating circuit comprises a circuit substantially similar to the non linear circuit to be linearzed, possibly having a power level which is lower than a power level of said non linear circuit, said distortion replicating circuit operating at Intermediate Frequency with signal conversion without spectrum reversal.

4. A circuit according to claim 1, wherein said distortion replicating circuit further comprises a distorting circuit.

5. A circuit according to claim 1, wherein there are two of said other channels and a function of said other channels is to process the two corresponding subdivided input signals so that they come out substantially undistorted, to provide the same gain as an undistorted portion of said first channel and to provide same group delay as a delay of said first channel.

6. A circuit according to claim 1, wherein said other channels comprise at least one attenuator and at least one amplifier.

7. A circuit according to claim 1, wherein said non linear circuit to be linearized is an amplifier.

8. A method of pre-distorting an input signal and providing a corresponding pre-distorted output signal feeding a non linear circuit to be linearized, particularly in microwave radio-frequency systems, wherein the method comprises the steps of:

providing a controlled attenuator for attenuating said received input signal to be pre-distorted and for providing a controlled attenuated input signal;

dividing said controlled attenuated input signal into subdivided input signal portions;

sending each of said subdivided input signal portions to respective channels, at a first of said channels, using a distortion replicating circuit including at least an invater to produce a signal having substantially the same distortion as a signal which will be at an output of the non linear circuit to be linearzed, at the others of said channels, managing the respective subdivided input signal portion in a linear manner, and summing the signals coming out of all of said channels.

9. A method according to claim 8, wherein said distortion replicating circuit comprises a circuit substantially similar to the non linear circuit to be linearized, possibly having a power level which is lower than a power level of said non linear circuit.

10. A method according to claim 8, wherein said distrtion replicating circuit comprises a circuit substantialy similar to the non linear circuit to be linearized and operating at Intermediate Frequency with signal conversion without spectrum revesal, possibly having a power level which is lower than a power level of said non linear circuit.

11. A method for post-linearizing a signal received as an output of a non linear circuit, and outputting a corresponding undistorted output signal, particularly for microwave radio-frequency systems, said method comprising:

providing a controlled attenuator for attenuating a received input signal to be post-linearized and providing a controlled attenuated input signal;

subdividing said controlled attenuated input signal into attenuated subdivided input signals;

sending each of attenuated divided input signal portions to respective channels, at a first of said channels, using a distortion replicating circuit to produce a signal having substantially the same distortion as a signal which will be at an output of the non linear circuit to be post-linearized, said cloning circuit including an inverter, at the others of said channels, managing the respective subdivided input signal portion in a linear manner, and summing output signals from all said channels.

12. A method according to claim 11, wherein the distortion replicating circuit is substantially similar to the non linear circuit whose output should be linearzed, possibly having a power level which is higher than power level of said non linear circuit.

13. A method according to claim 11, wherein the distortion replicating circuit is substantially similar to the non linear circuit whose output should be linearized, possibly having a power level which is higher than power level of said non linear circuit, said distortion replicating circuit operating at Intermediate Frequency with signal conversion without spectrum reversal.

14. A post-distortion circuit receiving as an input signal an output of a non linear circuit and outputting a corresponding undistorted output signal, particularly for microwave radio-frequency systems, said post distortion circuit comprising:

a controlled attenuator for attenuating said received input signal, a divider for properly subdividing said received input signal into subdivided input signals;

a plurality of channels each receiving a corresponding one of said subdivided input signals, a first of said channels comprising a distortion replicating circuit having an inverter and producing a signal having substantially the same distortion as a signal at an output of the non linear circuit, and others of said channels comprising respective substantially linear networks; and an adder for summing signals from said channels.

15. A circuit according to claim 14, wherein said distortion replicating circuit comprises a circuit substantially similar to said non linear circuit, possibly having a power level which is lower than power level of said non linear circuit.

16. A circuit according to claim 14, wherein said distortion replicating circuit comprises a circuit substantially similar to said non linear circuit, possibly having a power level which is lower than power level of said non linear circuit, said distortion replicating circuit operating at Intermediate Frequency with signal conversion without spectrum reversal.

17. A circuit according to claim 14, wherein said distortion replicating circuit further comprises a distorter.

18. A circuit according to claim 14, wherein there are two of said other channels and a function of each said other channel is to process two corresponding subdivided input signals so that they come out substantially undistorted, to provide a gain equal to that of an undistorted portion of said first channel, and to provide a group delay the same as a delay of said first channel.

19. A circuit according to claim 14, wherein said other channels comprise: at least one attenuator; and at least one amplifier.

* * * * *